(12) United States Patent
Ter Meulen et al.

(10) Patent No.: US 12,504,685 B2
(45) Date of Patent: Dec. 23, 2025

(54) TILED FLEXIBLE STAMP

(71) Applicant: MORPHOTONICS HOLDING B.V., Veldhoven (NL)

(72) Inventors: Jan Matthijs Ter Meulen, Eindhoven (NL); Leon Willem Veldhuizen, Veldhoven (NL); Bram Johannes Titulaer, Veldhoven (NL); Adrianus Van Erven, Casteren (NL)

(73) Assignee: Morphotonics Holding B.V., Veldhoven (NL)

( * ) Notice: Subject to any disclaimer, the term of this patent is extended or adjusted under 35 U.S.C. 154(b) by 341 days.

(21) Appl. No.: 17/767,041

(22) PCT Filed: Sep. 21, 2020

(86) PCT No.: PCT/EP2020/076243
§ 371 (c)(1),
(2) Date: Apr. 6, 2022

(87) PCT Pub. No.: WO2021/069195
PCT Pub. Date: Apr. 15, 2021

(65) Prior Publication Data
US 2022/0390838 A1 Dec. 8, 2022

(30) Foreign Application Priority Data
Oct. 9, 2019 (EP) .................................... 19202151

(51) Int. Cl.
*G03F 7/00* (2006.01)
*B29C 33/38* (2006.01)

(52) U.S. Cl.
CPC ........ *G03F 7/0015* (2013.01); *B29C 33/3842* (2013.01); *G03F 7/0002* (2013.01)

(58) Field of Classification Search
CPC ... B29C 33/06; B29C 33/306; B29C 33/3842; B29C 59/00; B29C 2059/023; B29C 59/02; G03F 7/0015; G03F 7/0002; G03F 7/20
See application file for complete search history.

(56) References Cited

U.S. PATENT DOCUMENTS

| 2003/0234343 A1 | 12/2003 | Cok et al. |
| 2009/0189306 A1 | 7/2009 | Terasaki |

(Continued)

FOREIGN PATENT DOCUMENTS

| CN | 105911815 A | 8/2016 |
| JP | 2015182278 A | * 10/2015 |

(Continued)

*Primary Examiner* — Galen H Hauth
*Assistant Examiner* — Mohamed K Ahmed Ali
(74) *Attorney, Agent, or Firm* — The Webb Law Firm (57) ABSTRACT

The invention relates to a scaled-up master for imprinting of micro- and nano-structures, the master being made-up from a plurality of tile-shaped master units, wherein the plurality of tile-shaped master units making-up the master comprises tile-shaped master units having a non-hexagonal shape wherein adjoining edges of neighbouring master units are parallel with each other and wherein the master units forming the master are arranged such that the splice lines between the master units only have junctions between master units where at most three corners of neighbouring master units are brought together. The invention further relates to a flexible stamp for imprinting of micro- and nano-structures, the flexible stamp being copied from such scaled-up master. Also an imprinted product is claimed which is copied from the flexible stamp.

14 Claims, 11 Drawing Sheets

(56) References Cited

U.S. PATENT DOCUMENTS

2012/0138571 A1    6/2012  Black et al.
2014/0093692 A1    4/2014  Miyazawa et al.
2021/0086407 A1*   3/2021  Peng ..................... G03F 7/0002

FOREIGN PATENT DOCUMENTS

WO    WO-2013147105 A1 *  10/2013    ......... B29C 33/3857
WO       2019130222 A1      7/2019

* cited by examiner

TILED FLEXIBLE STAMP

The invention relates to a scaled-up master for imprinting of micro- and nano-structures, the master being made-up from tile-shaped master units. The invention further relates to an assembly of stamp tiles for manufacturing the scaled-up master and to a flexible stamp copied from the scaled-up master.

Micro and nano structures are used to enhance the performance of products. This can either be the improvement of the efficiency of solar panels, using anti-reflective structures, or the creation of an optical 3D effect for displays, by use of micro lenses or nano gratings.

Structures can be added to products by use of imprint technology. There are different imprint technologies, as for instance wafer-scale UV-NIL, roll-to-roll imprinting or roll-to-plate imprinting. In each case a master structure, having the inverse structure as required on the product, is pressed upon the product with UV or thermal curable resin in between. After curing the resin is solidified and the master is removed from the product.

For the imprint technology there is a need to go to large area imprinting. This is for two reasons: 1) To have the opportunity to imprint textures on large products (i.e. solar panels or large displays). 2) To replicate multiple products in one replication cycle. Hereby the throughput is strongly increased.

Large area replication needs a large area master. The master price depends on the manufacturing time, and thereby the size of the masters. Large area masters are expensive. In roll-to-roll imprint technology this problem has been solved by using a seamless drum, as is for example disclosed in WO 2017/032758 A1. In this case, the diameter of the drum is carefully chosen to make sure that a continuous area is present without stitch lines. However, not all textures can be made in this manner at an affordable price.

A different solution is to make a large scaled-up master out of a small base master. With use of a step and repeat manner, the master structure is copied multiple times in a matrix structure. In between the replicated areas there are stitch or splice lines. By optimizing the process it is tried to have the stitch or splice width as small as possible. Examples of step and repeat methods are described e.g. in US2004/0124566 A1, U.S. Pat. No. 7,077,992 B2, using a wafer stepper, and KR 1017807289 B1, using a roller. KR 1017807289 B1 even aims at avoiding any stitch lines which may be visible borders in displays products. According to this document, a tiling technique is applied such that the replicated areas are arranged so that the replicated areas overlap at their adjacent edges (see also non-patent literature Jong G. Ok et al, "A step toward next-generation nanoimprint lithography: extending productivity and applicability"; Appl. Phys. A (2015) 121:343-356).

A cheaper method to enlarge the master is to tile multiple master units physically together. This is done for instance in U.S. Pat. No. 8,027,086 B2. Hereby flexible plastic master tiles are wrapped and fixed on the diameter of a stainless steel roller. In this case the stitch area will be larger compared to the step and repeat method. By pressing the different master unit tiles together the stitch area or seam between the master units is kept as small as possible. For certain textures the obtained larger stitch or splice width or seam width can be acceptable. Moreover it enables a second possibility; the tiling of multiple products together on one scaled-up master. CN 105911815 A discloses splicing of a plurality of master tiles or template units together to form a tile pattern. The template units are arranged on a substrate along alignment marks.

The use of a scaled-up master, made by tiling multiple masters or made of a plurality of nanoimprint template units in an imprint process will only work well if the quality of the stitches is well controlled. Large seams can interfere with the imprint process and can deteriorate the appearance of the imprint. And while tiling together, the position accuracy should be well controlled. Only with a well-controlled position accuracy the multiple active areas on the imprinted samples made with the scaled-up master can be cut out in straight lines. The seam appearance between the tiled master units and the seam width between the tiled master units often is of insufficient quality in that the width is too big and/or the tiled master units are misaligned and/or rotated.

It is therefore an object of the present invention to make available a scaled-up master for imprinting of micro- and nano-structures which scale-up master can easily scaled-up from a plurality of master units, wherein the master units have a high position accuracy and consequent improved seam appearance, and which scaled-up master can be made in a cost efficient way.

The problem is solved by a scaled-up master for imprinting of micro- and nano-structures, the master being made-up from a plurality of tile-shaped master units, wherein the plurality of tile-shaped master units forming the master comprises tile-shaped master units having a non-hexagonal shape, wherein adjoining edges of neighbouring master units are parallel with each other and wherein the master units forming the master are arranged such that the splice lines between the master units only have junctions between master units where at most three corners of neighbouring master units are brought together.

In the process of manufacturing of the large-area scaled-up master of the invention, a plurality of stamp tiles serving as templates for the master units are arranged, wherein the plurality of stamp tiles serving as templates for the master units comprise stamp tiles having a non-hexagonal shape. From these stamp tiles the master units building up the scaled-up master are formed via an imprint technology. At the same time, the scaled-up master is formed via the imprint technology from the plurality of stamp tiles. The large-area scaled-up master of the invention is then used as a master for multiple reproducing the structure of the master via an imprint technology, as wafer-scale UV-NIL, roll-to-roll imprinting or roll-to-plate imprinting.

According to the invention, it is required for the plurality of master-units to comprise master units having a non-hexagonal shape. In an embodiment of the scaled-up master, the plurality of master units may also comprise master units having a hexagonal shape in addition to the master units having a non-hexagonal shape. In any case the shape of the master units and the arrangement of the master units has to be such, that adjoining edges of neighbouring master units are parallel with each other and wherein the master units forming the master are arranged such that the splice lines between the master units only have junctions between master units where at most three corners of neighbouring master units are brought together, as will be further discussed later.

In an advantageous embodiment of the scaled-up master the master is formed of tile-shaped master units having a non-hexagonal shape, i.e. the scaled-up master does not comprise master units having a hexagonal shape.

The master units having a non-hexagonal shape may have a variety of shapes and master units having different shapes may be combined to build-up the scaled-up master, as long as the arrangement of the master units fulfils the requirements according to the invention. Preferably, the master units having a non-hexagonal shape have a square, a rectangular or a triangular shape or the shape of a trapezoid, of an axis-symmetric pentagon having right-angle basic angles or of a parallelogram with internal angles unequal 90° or have curved edges which have the form of an oscillating curve.

These statements made with respect to the master units in an analogous manner apply to the stamp tiles serving as templates for the master units. In a further preferred embodiment the stamp tiles, have a planar, flat form, i.e. they are not curved e.g. into a cylindrical form. In a likewise preferred embodiment the master units of the scaled-up master and scaled-up master have a planar, flat form, i.e. they are not curved e.g. into a cylindrical form.

While the processes of forming masters from stamp tiles are known in general, in the prior art processes—as mentioned above—seam appearance between the tiled master units of the prior art scaled-up masters and the seam width between the tiled master units often is of insufficient quality. It was found that with prior art tiling of the stamp tiles from which the scaled-up masters are made with four master units or tiles having a square or rectangular shape and meeting with their corners at a center point thus forming a cross joint, control of the position accuracy is difficult to achieve. When the stamp tiles according to the prior art are pushed or moved together when being conveyed to the imprinting station for transferring, i.e. imprinting the pattern of the multitude of stamp tiles to make the scaled-up master, it was observed that the last stamp tiles may push the other stamp tiles aside, resulting in a misaligned and rotated tiling. Moreover, the corners may easily be damaged because alignment forces are applied on the weak corners. This is a challenge, especially if brittle, fragile tiles are used, as no chips or corners should break aside. It goes without saying, that the misaligned and rotated tiling is also transferred to the scaled-up master and the tiled master units of the scaled-up master, respectively.

The inventors of the present scaled-up master found that misalignment of the stamp tiles and rotated tiling can be reduced or even avoided, if a plurality of stamp tiles comprising stamp tiles having a non-hexagonal shape are assembled such that the splice lines between the assembled stamp tiles only have junctions between stamp tiles where at most three corners of neighbouring stamp tiles are brought together, i.e. only have junctions where vertices of at most three stamp tiles meet. When conveying the stamp tiles having such a tiling, at the junctions a lower strain is generated on the corners or vertices of the stamp tiles, no pushing aside of stamp tiles occurs and a high alignment accuracy is obtained. At the same time, these advantages are transferred to the scaled-up master, which, according to the invention, is set-up from tile-shaped master units, wherein adjoining edges of neighbouring master units are parallel to each other and wherein the master units forming the master are arranged such that the splice lines between the master units only have junctions between master units where at most three corners of neighbouring master units are brought together, i.e. only have junctions where vertices of at most three master units meet. As a consequence, in the scaled-up master-units the master units have a high position accuracy resulting in an improved seam appearance.

Thus, according to the invention it is essential for the scaled-up master and the assembly of stamp files, from which the scaled-up master is formed, that the splice lines between the assembled master units and assembled stamp tiles, respectively, only have junctions where at most three corners of neighbouring master units and assembled stamp tiles, respectively, are brought together, i.e. encounter on each other. Moreover, it is necessary for the master units and the stamp tiles that adjoining edges of neighbouring master units and stamp tiles, respectively, are parallel with each other.

The edges of the master units may be straight, may have protrusions, notches or the like or may be curved. In either case it is important that the adjoining edges of neighbouring master units and stamp tiles, respectively, are parallel with each other. Master units having a non-hexagonal shape and which do not have curved edges having the form of an oscillating curve preferably have straight edges without any protrusions, notches or the like.

In case of curved edges the edges may in a preferred embodiment have the form of an oscillating curve and in a more preferred embodiment have a sinusoidal shape. In this case, the master units may have four edges and edges being opposite to each other may have an oscillating shape, as a preferred example a sinusoidal shape. It is also possible that only one pair of edges being opposite to each have a sinusoidal shape while the other two edges are straight. The master units having curved edges may be arranged in columns in a direction of a length extension of the scaled-up master or in rows in a direction perpendicular to the length direction, wherein the master units of one column or one row show an offset from the master units of the neighbouring column and row, respectively. Through this it is achieved that cross-junctions are avoided and only junctions between master units are obtained, where at most three corners of neighbouring master units are brought together, as is required according to the present invention.

In a preferred embodiment, the master units and the stamp tiles, from which they have been formed, may have a square or rectangular shape and straight edges. In this case, the junctions, where the at most three corners of neighbouring master units and assembled stamp tiles, respectively, meet, have a T-shape. In the preferred case the master units have a square or rectangular shape, the scaled-up master may have a length extension and the master units preferably may be arranged in rows in the length extension with preferably equally sized master units within a row, wherein the master units of one row show an offset from the master units of the neighbouring row.

In a likewise preferred embodiment, the scaled-up master has a length extension and the master units may be arranged in rows with preferably equally sized master units within a row, which rows extend perpendicular to the length extension, wherein the master units of one row show an offset from the master units of the neighbouring row.

In the preferred embodiments with master units being arranged either in columns in a length extension of the scaled-up master or in rows in a direction perpendicular to the length extension, wherein the master units of one row show an offset from the master units of the neighbouring row, it is further preferred that the offset is such that along the splice lines the junctions have a distance of at least 10 mm from each other.

The master units preferably may have an active area with relief structure. In a preferred embodiment the active area may extend over the complete surface of each master unit and, as a consequence, may cover the whole area of the scaled-up master unit, thus forming a scaled-up or large scale active area. As a result, also for the flexible stamp, in a preferred embodiment the whole area of the flexible stamp is covered with an active area having a relief structure. In this case, the flexible stamp may be brought to a required size by cutting out a large-scale segment from the entire active area. In an alternative, when using the complete flexible stamp for producing an imprinted product having micro- and/or nano-structures, a large-scale segment covered with a large scale active area can be cut out from the imprinted product.

In a further preferred embodiment, the active area may extend only over a part of the surface of each master unit. In this case, the active area may have various shapes. It may have, e.g., a square or rectangular shape or may be circular or ellipsoidal. In the preferred embodiments with master units being arranged either in columns in a length extension of the scaled-up master or in rows in a direction perpendicular to the length extension with each master unit having an active area with relief structure extending only over a part of the surface of each master unit, in order to assure an easy cut of multiple tiled products from a final large-scale imprinted product, the active areas should be placed in straight rows and/or straight columns within the scaled-up master. In this case, the active areas preferably are arranged within the corresponding master units such and the offset between the master units of neighbouring rows and or columns is such, that the active areas of neighbouring master units are aligned in straight rows and/or straight columns with an alignment accuracy of less than +/−1 mm. More preferably, the active areas are arranged within the corresponding master units and the offset between the master units of neighbouring rows such that the active areas of neighbouring master units are aligned with an alignment accuracy of less than +/−100 μm and most preferably with an alignment accuracy of less than +/−20 μm.

In a further preferred embodiment, the master units may have a triangular shape or the shape of a trapezoid, and the scaled-up master has junctions between master units with a Y-shape. Likewise, in a further preferred embodiment the stamp tiles may have a triangular shape or the shape of a trapezoid and the assembly of stamp tiles has junctions between the tiled stamps with a Y-shape.

The scaled-up master of the invention may comprise master units having different non-hexagonal shapes as long as the splice lines between the master units only have junctions between master units where at most three corners of neighbouring master units are brought together. Further, the scaled-up master of the invention may preferably be built-up from master units having a triangular shape together with master units having the shape of a trapezoid. In this case, in a preferred embodiment the scaled-up master may comprise master units having the shape of a isosceles triangle and master units having the shape of a isosceles trapezoid, wherein the isosceles triangles and the isosceles trapezoids have the same base angles and wherein the master units are arranged in rows either in direction of a length extension of the scaled-up master or in direction perpendicular this length extension and the isosceles triangles and the isosceles trapezoids are arranged within the rows in an alternating order.

In a further preferred embodiment the scaled-up master may be set-up from master units having a triangular shape and master units having the shape of a trapezoid and the assembly of stamp tiles, respectively, may be set-up from stamp tiles having a triangular shape and stamp tiles having the shape of a trapezoid. In this case, preferably the scale-up master and the assembly of stamp tiles, respectively, may preferably be made-up from at least one square or rectangular element formed from two equal sized right-angle trapezoids and one isosceles triangle, wherein the base angles of the isosceles triangle and the base angle of the right-angle trapezoids adjacent to the base angles of the isosceles triangle together form a right angle.

In a further embodiment the scaled-up master is built-up from a combination of master units having the shape of a regular hexagons or hexagons being stretched along one symmetry direction, with master units having the shape of an axis-symmetric pentagon having right-angle basic angles and with right-angle trapezoids. The hexagons, pentagons and right-angle trapezoids preferably are matched with respect to their sizes and their contours and arranged such that they result in a scaled-up master having a rectangular form.

The scaled-up master of the invention is in particular well suited for the manufacturing of flexible stamps to be used for imprinting of micro- and nano-structures. The present invention therefore also relates to flexible stamps, copied from the scaled-up master according to the invention. The flexible stamp has tiled sub-units with the same tiled pattern as the master units of the scaled-up master. Thus, the present invention also relates to a flexible stamp for imprinting of micro- and nano-structures, the flexible stamp being made-up from a plurality of tile-shaped sub-units, wherein plurality of tile-shaped sub-units comprise tile-shaped sub-units having a non-hexagonal shape, wherein adjoining edges of neighbouring sub-units are parallel with each other and wherein the sub-units are arranged in the flexible stamp such that the splice lines between the sub-units only have junctions between sub-units where at most three corners of neighbouring sub-units are brought together. As to preferred embodiments of the flexible stamp of the invention the same applies as for the scaled-up master of the invention, correspondingly, in that—as mentioned—the sub-units of the flexible stamp basically correspond to the master units of the scaled-up master.

The invention further relates to an imprinted product replicated from the flexible stamp according to the invention. It goes without saying that the imprinted product may have the same structure in its surface regarding the tiling as the flexible stamp from which it is copied or replicated. Therefore, with regard to preferred embodiments of the imprinted product of the invention for the imprinted product according to the invention the same applies as for the flexible stamp of the invention and as for the scaled-up master of the invention, respectively. This is because the sub-units of the flexible stamp, which correspond to the master units of the scaled-up master, generate segments in the imprinted product having the same shape and arrangement as the sub-units of the flexible stamp.

Regarding the design of the flexible stamp of the invention and its construction embodiments disclosed on the prior art can be used. In this respect, reference is made to flexible stamps as exemplified for example in U.S. Pat. No. 7,824,519 B1, WO 2016/128494 or unpublished European patent application no. EP18200147.9.

The invention is explained now in more detail with reference to the following figures, wherein the scope of the invention is not limited by the figures.

Figure 1:
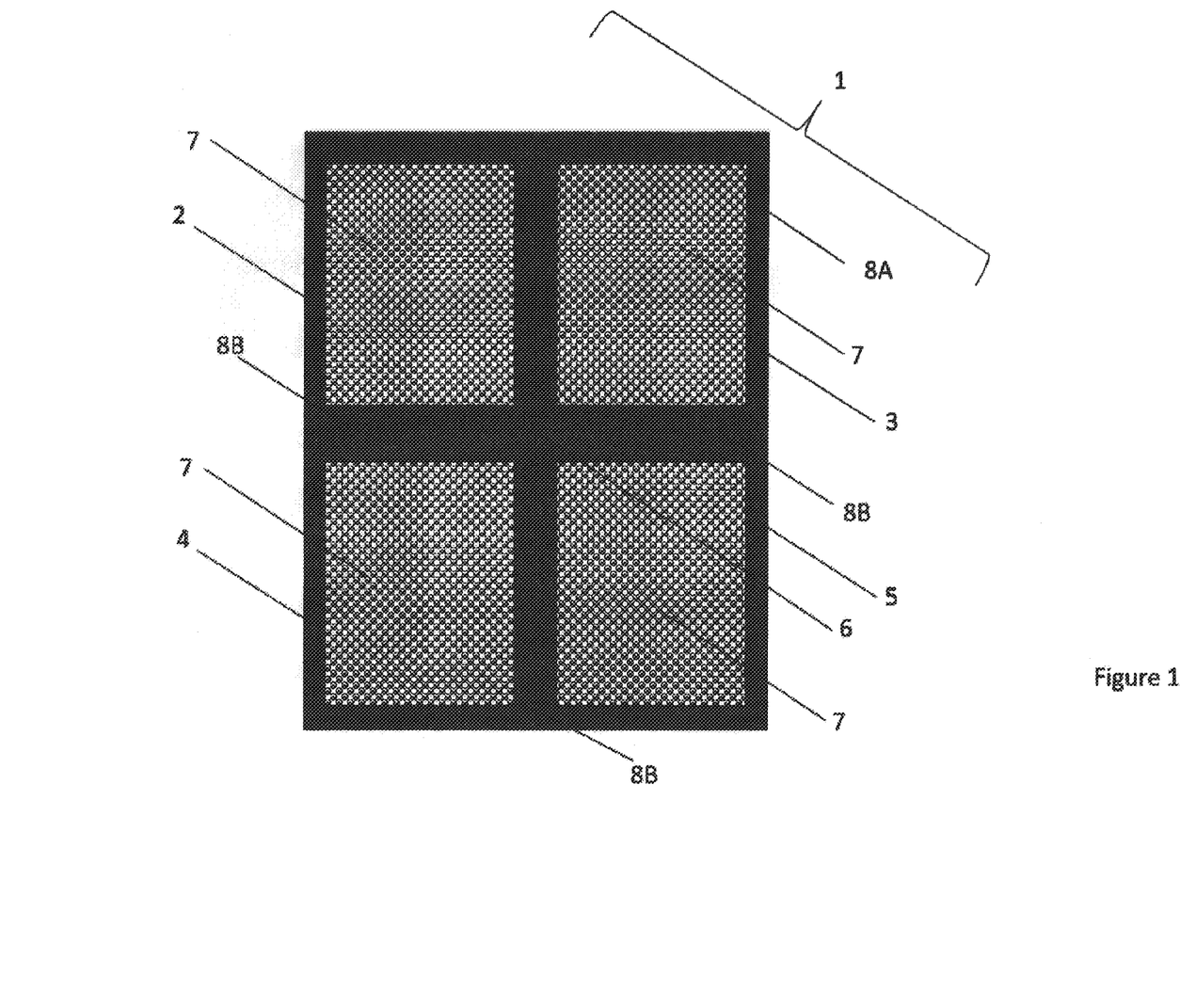
FIG. 1: Assembly of stamp tiles with four corner junction (prior art)

FIG. 1 shows a prior art assembly of stamp tiles 1, from which a scaled-up master can be made. In this example, four stamp tiles 2, 3, 4, 5 having a rectangular shape are arranged such that they meet with their corners at a center point thus forming a cross joint or cross junction 6. The stamp tiles 2, 3, 4, 5 may have active areas 7 with relief structure, which in the present case cover part of the surface of the stamp tiles 2, 3, 4, 5 and have edges parallel to the edges 8A of the stamp tiles 2, 3, 4, 5.

Initially, the four stamp tiles 2, 3, 4, 5 are arranged with adjoining edges 8A of neighbouring stamp tiles being parallel with each other and the splice lines 8B (also called stitch lines or seams) formed between adjoining edges 8A of the stamp tiles are uniform and well controlled.

Figure 2:
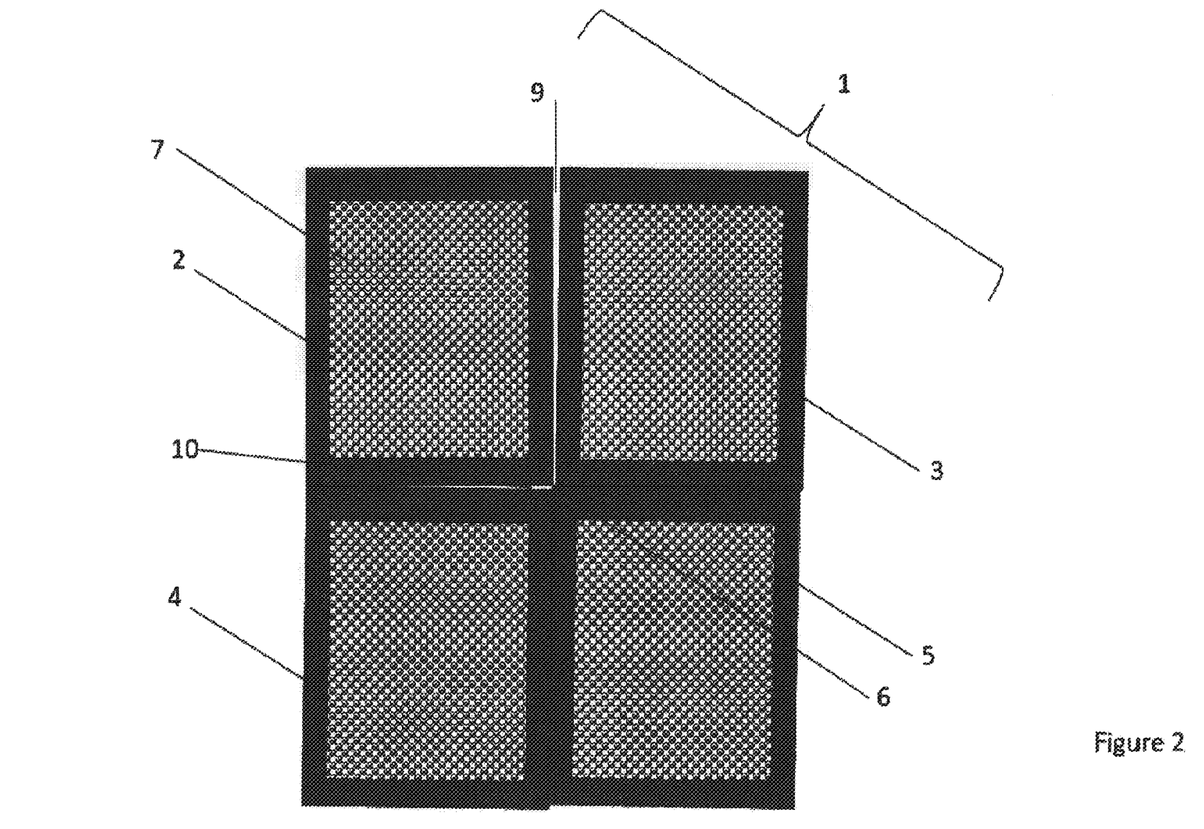
FIG. 2: Assembly of stamp tiles with four corner junction after being moved together when being conveyed to an imprinting station (prior art)

When the stamp tiles 2, 3, 4, 5 of the prior art assembly of stamp tiles 1 of FIG. 1 are pushed or moved together when being conveyed to a imprinting station for transferring, i.e. imprinting the pattern of the multitude of stamp tiles to make the scaled-up master, the last stamp tiles 4 and 5 may push the other stamp tiles 2, 3 aside, resulting in a misaligned and rotated tiling. It should be mentioned that for such an assembly of stamp tiles as shown in FIG. 1 misaligned and rotated tiling may already be created during the tiling process itself, i.e. when the stamp tiles are arranged next to each other. This leads to non-uniform gaps 9, 10 between the stamp tiles 2, 3, 4, 5 and high strain levels at the corners at cross junction 6, as shown in FIG. 2. When manufacturing of a large-area scaled-up master from this assembly of stamp tiles 1 having misaligned and rotated tiling and non-uniform gaps, also the scaled-up master will show the same deficiencies.

Figure 3:
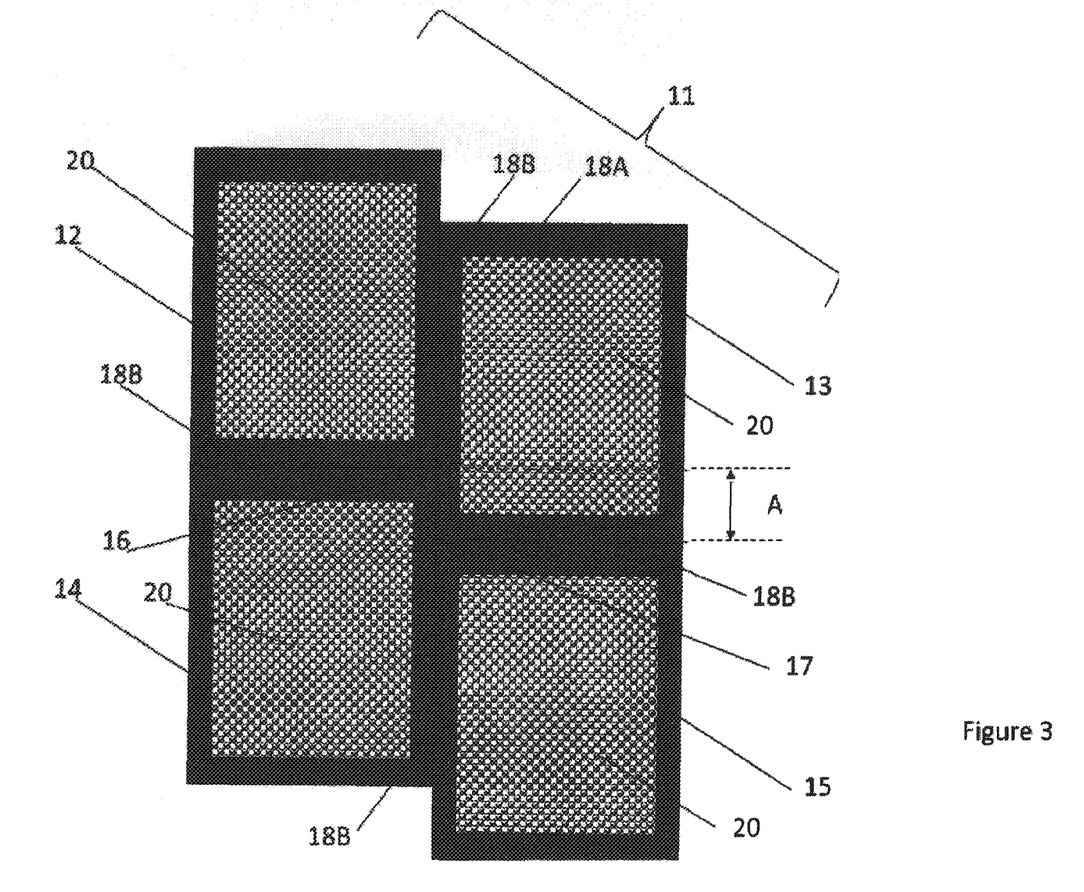
FIG. 3: Scaled-up master according to the invention, which is set-up from four master units having a rectangular shape and straight edges.

FIG. 3 shows a scaled-up master 11 according to the invention, which is set-up from four master units 12, 13, 14, 15 having a rectangular shape and straight edges. The master units 12, 13, 14, 15 are arranged in columns such that adjoining edges of neighbouring master units 12, 13, 14, 15 are parallel with each other. The master units 12, 13, 14, 15 forming the scaled-up master 11 are arranged such that the splice lines 18B between the master units 12, 13, 14, 15 only have junctions 16, 17 between the master units 12, 13, 14, 15, where three corners of neighbouring master units are brought together, so that the junctions 16 and 17 have a T-shape. This is achieved for the scaled-up master 11 of FIG. 3 by an arrangement of the master units 12, 13, 14, 15 such that the master units 12, 14 of one row show an offset from the master units 13,15 of the neighbouring row. By this offset it is furthermore achieved that along the splice lines 18B the junctions 16 and 17 have a distance A from each other.

In the process of manufacturing the scaled-up master of FIG. 3 an assembly of stamp tiles is used, which is build-up from stamp tiles having the same configuration or inverse configuration having the negative of the texture as the master units of the scaled-up master 11. This means that the assembly of stamp tiles, from which the scaled-up master 11 of FIG. 3 is made, also have a rectangular shape, are arranged in rows in the length extension, wherein the assembled stamp tiles of one row show an offset from the assembled stamp tiles of the neighbouring row, resulting in junctions, where only three corners of neighbouring stamp tiles meet, resulting in junctions having a T-shape. If the stamp tiles of such an assembly are pushed or moved together when being conveyed to the imprinting station for transferring, i.e. imprinting the pattern of the multitude of stamp tiles to make the scaled-up master, at the junctions a lower strain is generated on the corners or vertices of the stamp tiles, no pushing aside of stamp tiles occurs and a high alignment accuracy is obtained.

At the same time, these advantages are transferred to the scaled-up master 11. The four master units 12, 13, 14, 15 of the scaled-up master of FIG. 3 are therefore arranged with adjoining edges 18A of neighbouring stamp tiles being parallel with each other and the splice lines 18B (also named stitch lines or seams) formed between the master units 12, 13, 14, 15 are thus uniform and well controlled.

As has been shown for the stamp tiles 2, 3, 4, 5 of FIGS. 1 and 2, also the master units 12, 13, 14, 15 of the scaled-up master 11 of FIG. 3 may have active areas 20 with relief structure, which in the present case cover part of the surface of the master units 12, 13, 14, 15 and have edges parallel to the edges of the master units 2 13 14, 15.

Figure 4:
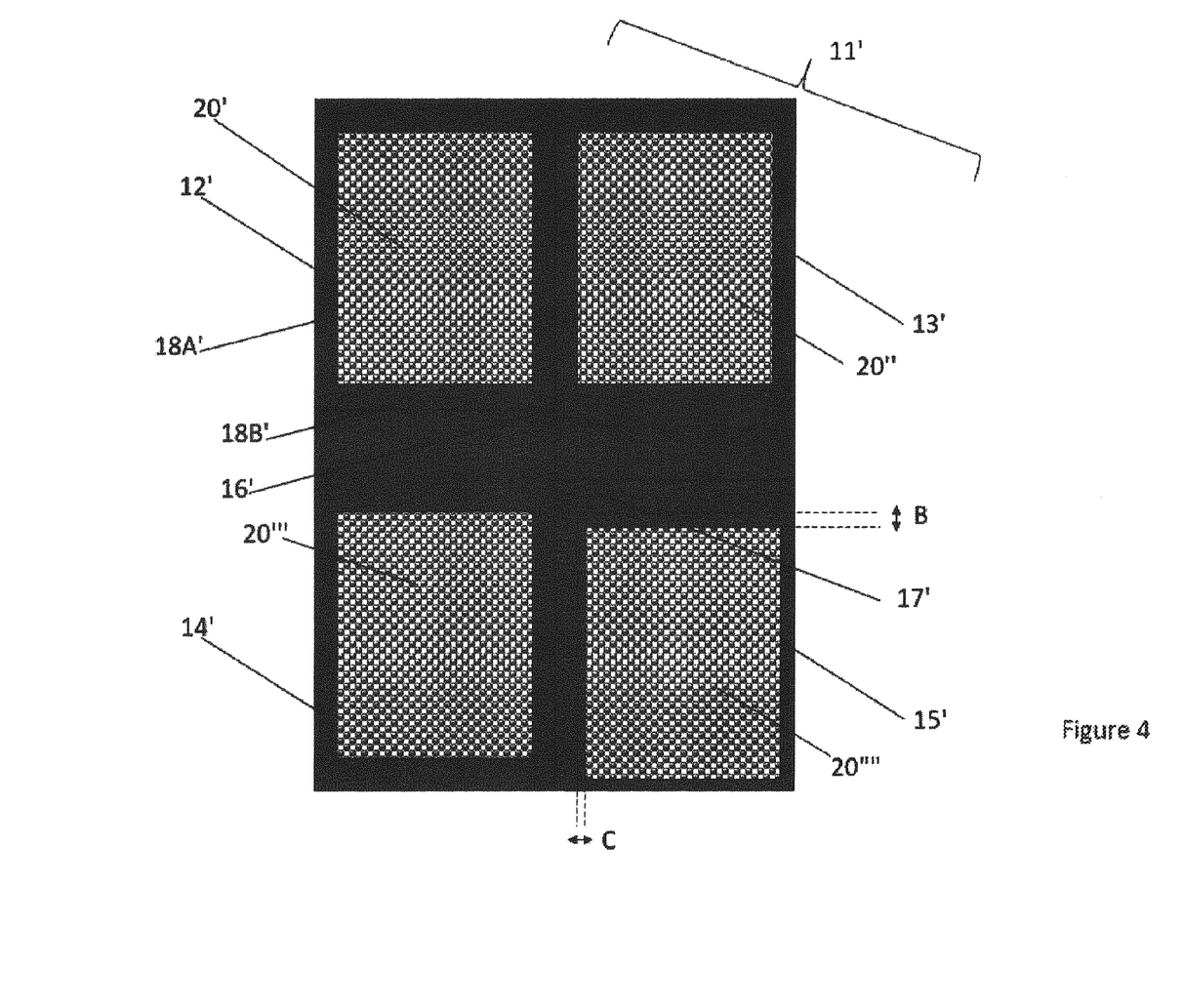
FIG. 4: Scaled-up master according to the invention, which is set-up from four master units having a rectangular shape and straight edges and aligned active areas.

FIG. 4 shows another scaled-up master 11' of the invention. As the scaled-up master 11 of FIG. 3, the scaled-up master 11' of FIG. 4 is set-up from four master units 12', 13', 14', 15' having a rectangular shape and straight edges. The master units 12', 13', 14', 15', too, have active areas 20', 20'', 20''', 20'''' with relief structure, which cover part of the surface of the master units 12', 13', 14', 15' and have edges parallel to the edges of the master units 12', 13', 14', 15'. The master units 12', 13', 14', 15' are arranged in columns such that adjoining edges 18A' of neighbouring master units 12', 13', 14', 15' are parallel with each other. The master units 12', 13', 14', 15' forming the scaled-up master 11' are arranged such that the splice lines 18B' between the master units 12', 13', 14', 15' only have junctions 16', 17', where three corners of neighbouring master units are brought together, so that the junctions 16', 17' have a T-shape.

Different from the master units forming the scaled-up master of FIG. 11, the master units 12', 13', 14', 15' of the scaled-up master 11' of FIG. 4 are different in size, while the size of the active areas in the master units 12', 13', 14', 15' is the same for all master units. In order to assure an easy cut of multiple tiled products from a final large-scale imprinted product, the active areas 20', 20'', 20''', 20'''' are placed in straight rows and/or straight columns within the scaled-up master 11' and the active areas 20', 20'', 20''' 20'''' are arranged within the corresponding master units such and the offset between the master units of neighbouring rows and or columns is such, that the active areas of neighbouring master units are aligned in straight rows and/or straight columns with required alignment accuracy, which are shown in FIG. 4 as distances B and C. According to the invention, the alignment accuracy preferably is less than +/−1 mm.

Figure 5:
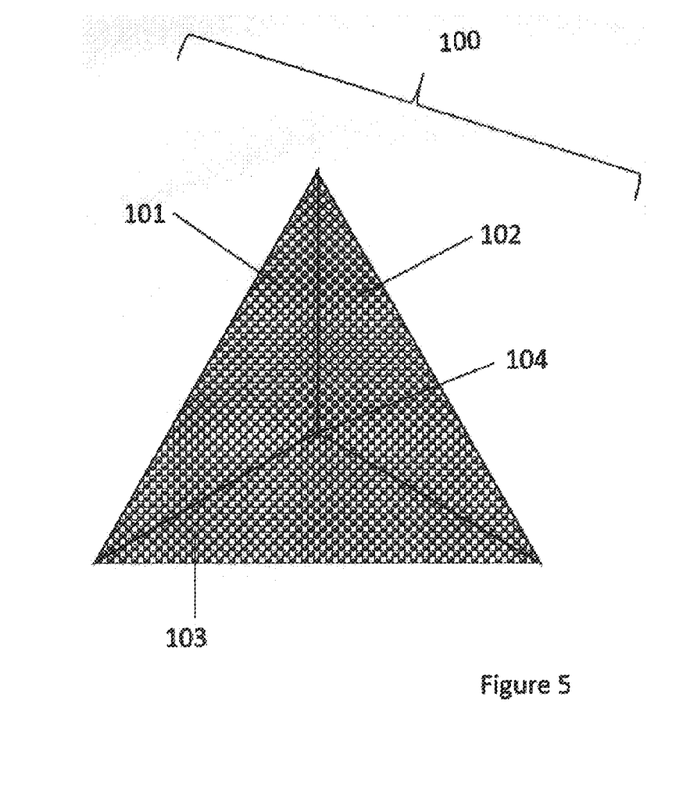
FIG. 5: Scaled-up master according to the invention, set-up from three equally sized master units having the form of isosceles triangles.

FIG. 5 shows an embodiment of a scaled-up master 100 according to the invention which is set-up from three equally sized master units 101,102,103 having the form of isosceles triangles, and the scaled-up master 100 has a junction 104 between master units 101,102,103 with a Y-shape. The master units 101,102,103 of scaled-up master 100 are arranged to form the scaled-up master 100 such that the legs of the isosceles triangles are attached to each other.

The scaled-up master 100 of FIG. 5 has an active area covering the whole surface of the scaled-up master 100.

Figure 6:
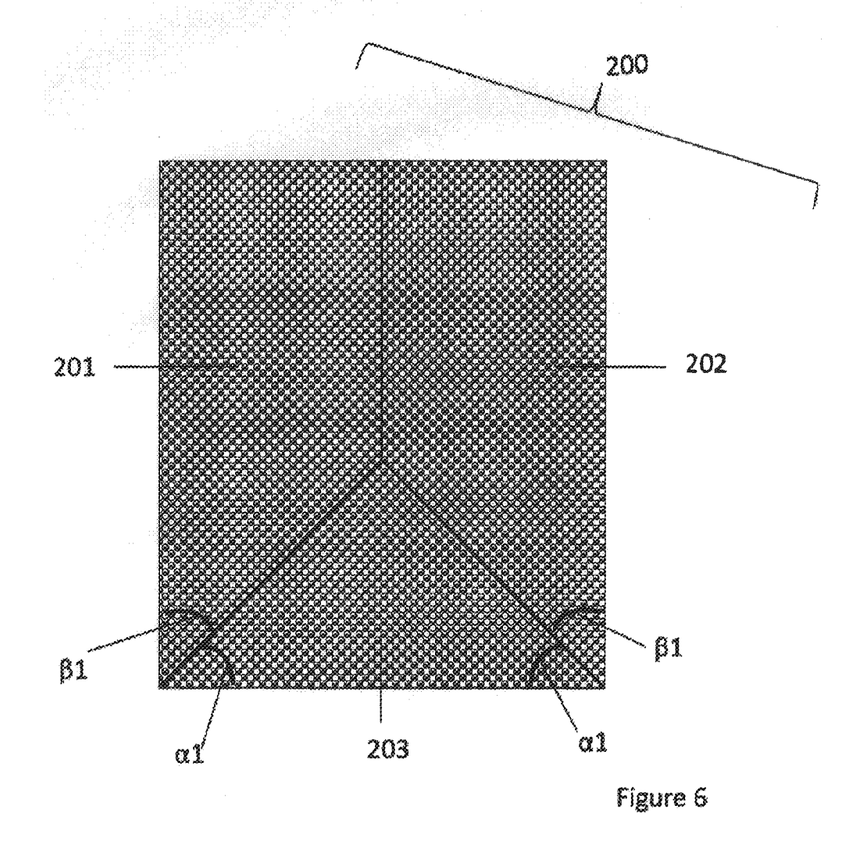
FIG. 6: Scaled-up master formed from two equally sized right-angle trapezoids and one isosceles triangle

In FIG. 6 a scaled-up master 200 according to the invention is shown, which has a rectangular shape and is formed from two equally sized right-angle trapezoids 201, 202 and one isosceles triangle 203, wherein the base angles $\alpha_1$, $\alpha_2$ of the isosceles triangle 203 and the base angles $\beta_1$, $\beta_2$ of the right-angle trapezoids 201,202 adjacent to the base angles $\alpha_1$, $\alpha_2$ of the isosceles triangle 203 together form a right angle. The scaled-up master 200 of FIG. 6, too, has an active area covering the whole surface of the scaled-up master 200.

Figure 7:
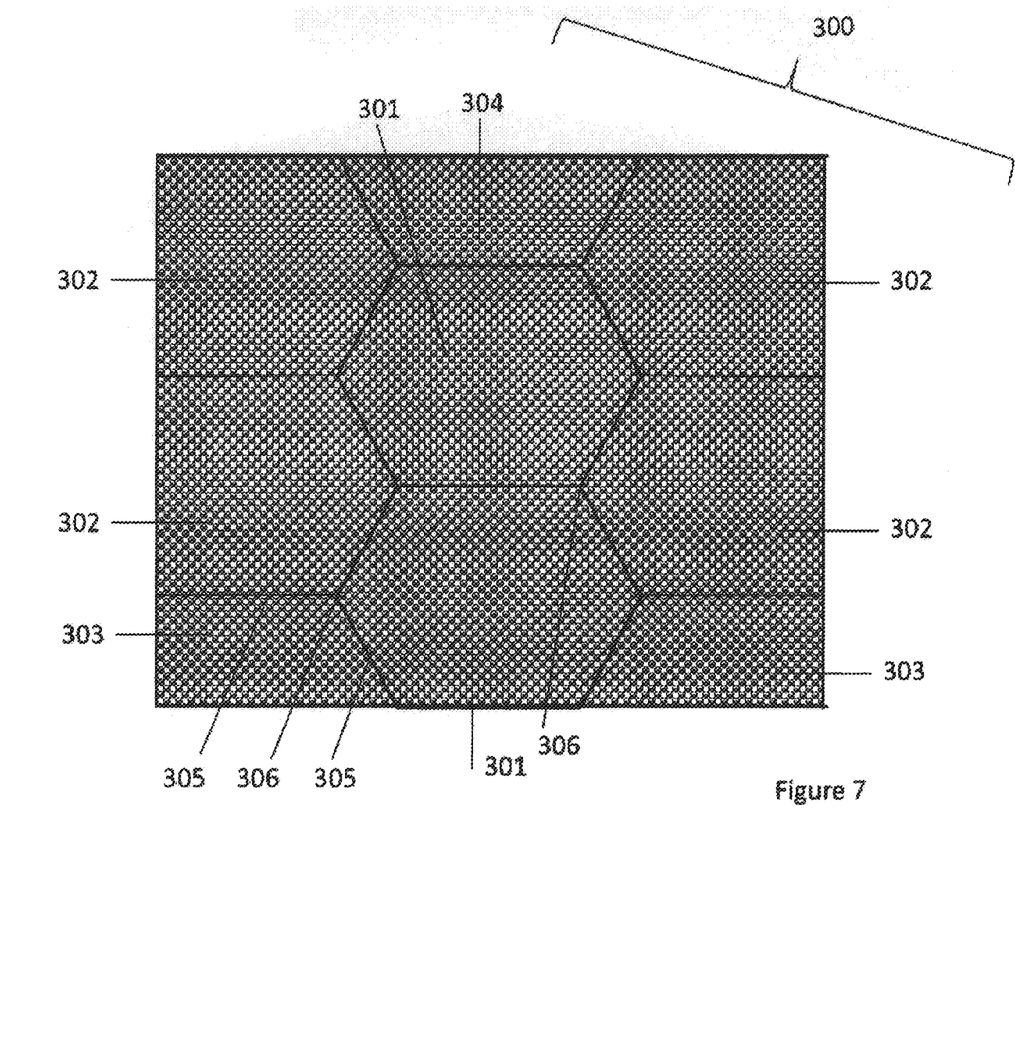
FIG. 7: Scaled-up master formed from a combination of master units having the shape of a regular hexagons being stretched along one symmetry direction, master units having the shape of a axis-symmetric pentagon, master units having the form of right-angle trapezoids and a master unit having the form of an isosceles trapezoid.

In FIG. 7 a scaled-up master 300 is shown which is formed from a combination of master units 301 having the shape of a regular hexagons being stretched along one symmetry direction, with master units 302 having the shape of an axis-symmetric pentagon having right-angle basic angles and with master units 303 having the form of right-angle trapezoids and finally a master unit 304 having the form of an isosceles trapezoid. The hexagons, pentagons, right-angle trapezoids and the isosceles trapezoid are matched with respect to their sizes and their contours and arranged such that they result in a rectangular form. For the scaled-up master unit of FIG. 7 the splice lines 305 between the master units 301,302,303,304 only have junctions 306 where three corners of neighbouring master units are brought together, which junctions have a Y-shape.

Also the scaled-up master 300 of FIG. 7 has an active area covering the whole surface of the scaled-up master 300, as is indicated by the dotted marking.

Figure 8:
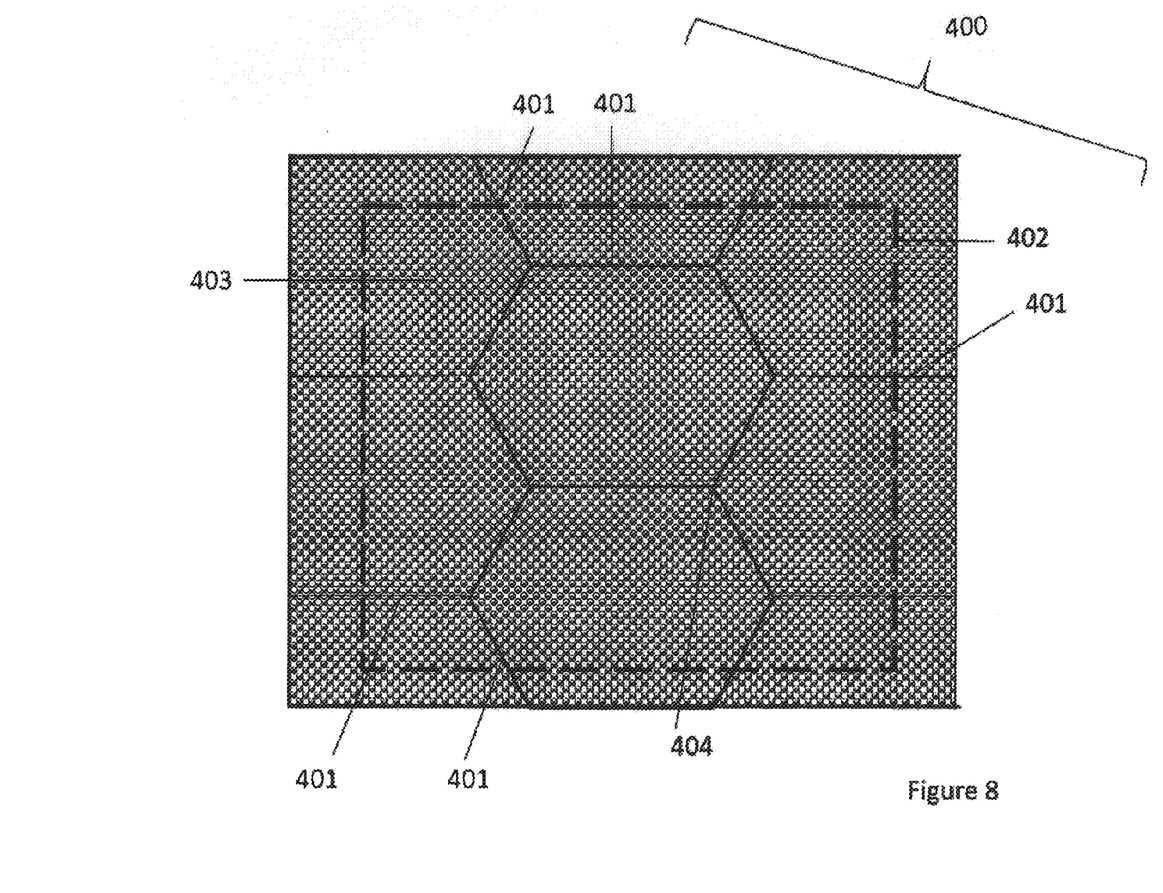
FIG. 8: Imprinted product, which may be obtained from a flexible stamp which in turn is manufactured from the scaled-up master shown in FIG. 7, from which imprinted product a large scale imprinted structure is cut.

In FIG. 8 schematically an imprinted product 400, which may be obtained from a flexible stamp which in turn is manufactured from the scaled-up master shown in FIG. 7. The imprinted product 400 has over its whole surface an active area. The splice lines 305 between the master units which are present for the scaled-up master of FIG. 7 may also be visible as seams, boarders or stitch lines 401 on the final imprinted product 400.

As is indicated by the dotted line 402 in FIG. 8 a large scale imprinted structure 402 may be cut from the imprinted product 400 along the dotted line 403.

Figure 9:
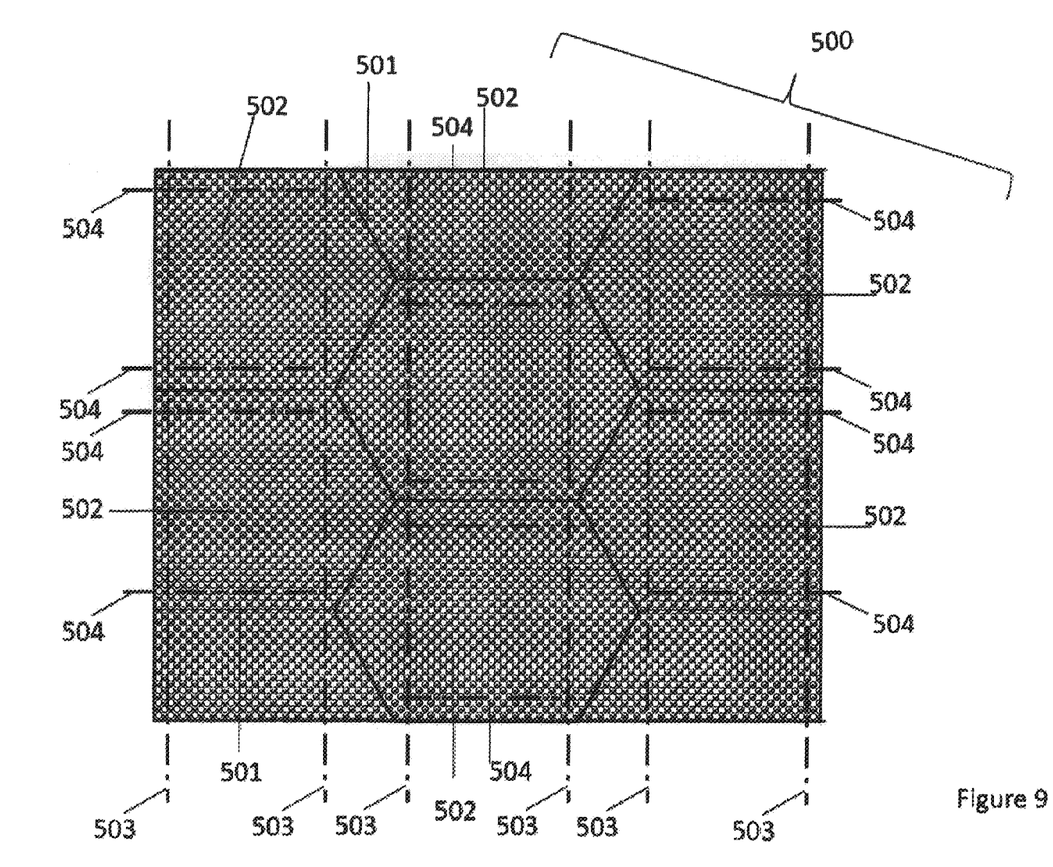
FIG. 9: Imprinted product, which may be obtained from a flexible stamp which in turn is manufactured from the scaled-up master shown in FIG. 7, from which imprinted product a multitude of smaller imprinted structures is cut.

In a further embodiment shown in FIG. 9 a multitude of smaller imprinted structures 502 can be obtained from an imprinted product 500 corresponding to the imprinted product 400 shown in FIG. 8. Again, as is indicated by the dotted lines 503, 504 in FIG. 9, segments 502 can be cut from the imprinted product 500, which are smaller in size than the tiles originating from the master units of the scaled-up master, from which the imprinted structure finally stems and which are visible as tiles surrounded by the stitch lines 501.

Imprinted structures 502 may be obtained by first cutting the imprinted product 500 along lines 503 and afterwards along lines 504. Thus, as is shown in FIG. 9, a scaled-up master as shown in FIG. 7 may be used for a manufacturing process in which in one replication cycle multiple products, i.e. multiple smaller imprinted structures can be replicated.

Figure 10:
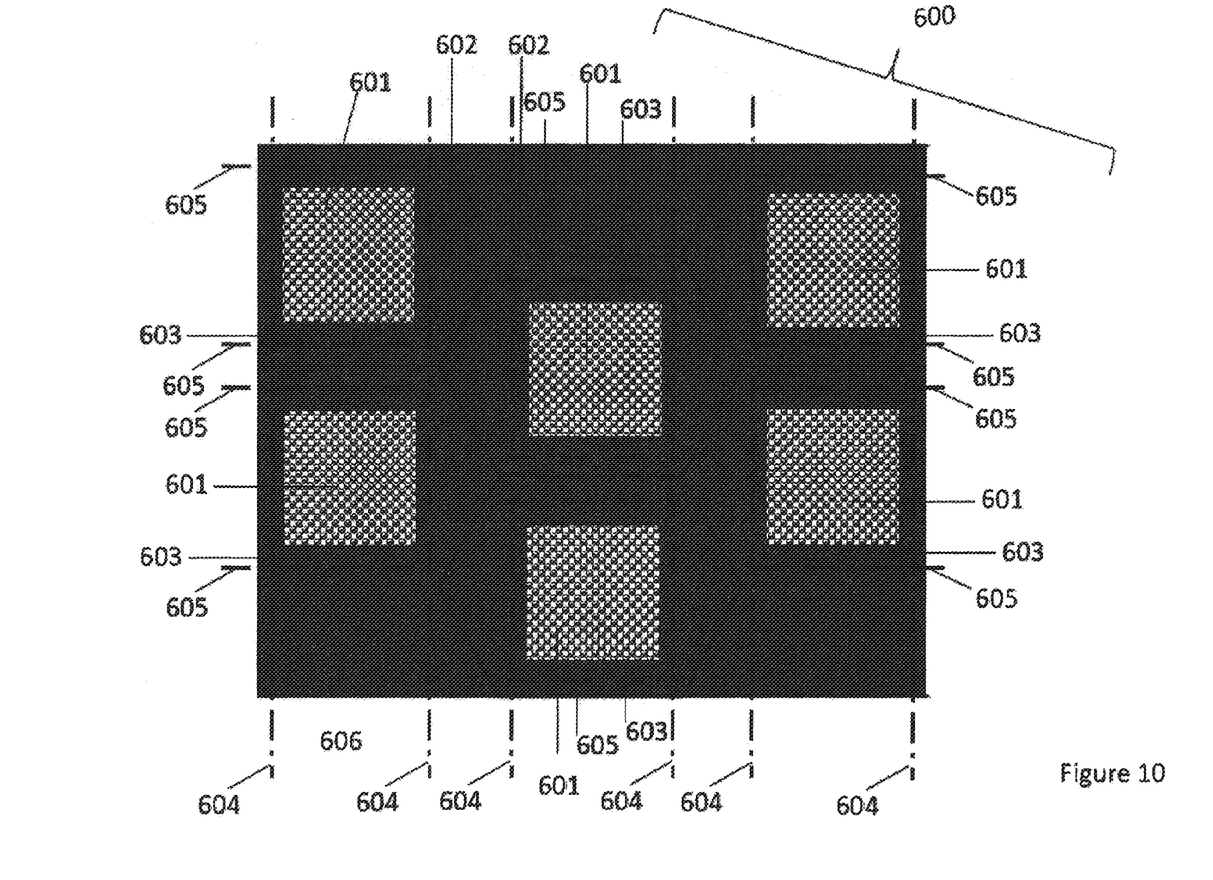
FIG. 10: Imprinted product, which may be obtained from a flexible stamp which in turn is manufactured from a scaled-up master similar to the one shown in FIG. 7, from which imprinted product a multitude of smaller imprinted structures is cut with segmented active areas.

FIG. 10 shows an embodiment of an imprinted product 600 which is stems from a scaled-up master similar to the one shown in FIG. 7. In contrast to the scaled-up master shown in FIG. 7, the scaled-up master which forms the basis for the imprinted product 600 in FIG. 10, the master units each have a rectangular active area covering only part of the surface of the master units. As a result, the imprinted product 600 shown in FIG. 10 also has rectangular segments 601 of active area within the tiles surrounded by the stitch lines 602. Imprinted structures 603 may be obtained by first cutting the imprinted product 600 along lines 604 and afterwards along lines 605. Thus, as is shown also in FIG. 10, a scaled-up master similar as shown in FIG. 7 may be used for a manufacturing process in which in one replication cycle multiple products, i.e. multiple smaller imprinted structures can be replicated.

Figure 11:
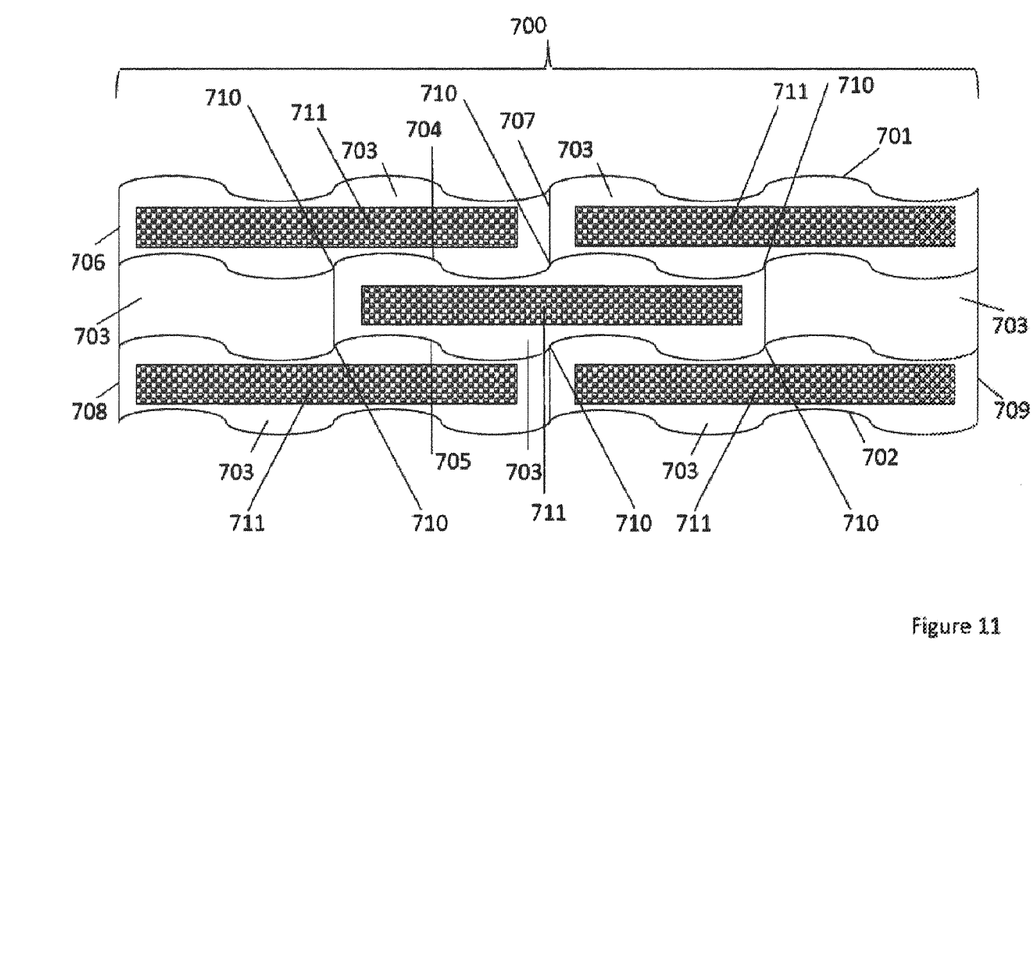
FIG. 11: Scaled-up master having curved upper and lower edges, which scaled-up master is set-up from tiled master units arranged in rows and which master units have edges of sinusoidal form on two opposite sides.

FIG. 11 shows an example of a scaled-up master 700 having curved upper and lower edges 701, 702, which scaled-up master 700 is set-up from tiled master units 703, which are arranged in rows. Master units 703 have on two opposite sides edges 704, 705 of oscillating or sinusoidal form. The other two edges 706, 707 of the master units 703 and the other two edges 708, 709 of the scaled-up master 700 are straight. The sinusoidal line formed from the sinusoidal edges 704, 705 of the master units of one row runs parallel to the sinusoidal line formed from the sinusoidal edges 704, 705 of the master units of the neighbouring row. The straight edges 706, 707 of the master units 703 of one row have an off-set with respect to the straight edges 706, 707 of the master units 703 of the neighbouring row. By this, along the sinusoidal splice lines between the master units 703 only junctions 710 between master units 703 exist where two corners of neighbouring master units 703 are brought together and meet with the continuous sinusoidal edge 704, 705 of a third master unit. In the scaled-up master 703 of FIG. 11 master units 703 have rectangular sections of active area 711.

The invention claimed is:

1. A scaled-up master for imprinting of micro-structures and nano-structures, the master comprising a plurality of tile-shaped master units, wherein the plurality of tile-shaped master units comprises tile-shaped master units having a non-hexagonal shape, wherein adjoining edges of neighbouring master units are parallel with each other;
   wherein the master units forming the master are arranged such that splice lines between the master units only have junctions between master units where at most three corners of neighbouring master units are brought together; and
   wherein each master unit has an active area with a relief structure, wherein the active area extends only over a part of the surface of each master unit.

2. The scaled-up master according to claim 1, wherein the master is made-up from tile-shaped master units having a non-hexagonal shape.

3. The scaled-up master according to claim 1, wherein the master units having a non-hexagonal shape comprise:
   a square shape, a rectangular shape or a triangular shape; or a trapezoidal shape, of an axis-symmetric pentagon having right-angle basic angles or of a parallelogram with internal angles unequal 90°; or curved edges which have a form of an oscillating curve.

4. The scaled-up master according to claim 1, wherein the scaled-up master has a length direction and the master units are arranged in rows in the length direction, wherein the master units of one row create an offset from the master units of the neighbouring row.

5. The scaled-up master according to claim 1, wherein the master has a length direction and the master units are arranged in rows perpendicular to the length direction, wherein the master units of one row create an offset from the master units of the neighbouring row.

6. The scaled-up master according to claim 2, wherein the master units have a square or rectangular shape and have straight edges and junctions have a T-shape.

7. The scaled-up master according to claim 6, wherein the master units within a row are equally sized.

8. The scaled-up master according to claim 1, wherein the active area has edges parallel to the edges of a corresponding master unit, wherein the active areas are arranged within the corresponding master units and an offset between the master units of neighbouring rows such that the active areas of neighbouring master units are aligned with an alignment accuracy of less than +/−1 mm.

9. The scaled-up master according to claim 1, wherein the scaled-up master is built-up from master units having a triangular shape or a trapezoidal shape or of an axis-symmetric pentagon having right-angle basic angles and the scaled-up master has junctions between master units with a Y-shape.

10. The scaled-up master according to claim 9, comprising master units having a triangular shape and master units having a trapezoidal shape.

11. The scaled-up master according to claim 1, wherein the master units have curved edges which have a form of an oscillating curve.

12. The scaled-up master according to claim 1, wherein the active areas are configured in straight rows and/or straight columns within the scaled-up master.

13. The scaled-up master according to claim 12, wherein an offset between the master units of neighbouring rows and/or columns is configured so that the active areas of neighbouring master units are aligned in straight rows and/or straight columns with an alignment accuracy of less than +/−1 mm.

14. The scaled-up master according to claim 1, wherein the plurality of tile-shaped master units further comprises at least one tile-shaped master unit having a hexagonal shape.

* * * * *